(12) United States Patent
Sun (10) Patent No.: US 10,270,455 B2
(45) Date of Patent: Apr. 23, 2019

(54) MULTI-PHASE CLOCK GENERATION EMPLOYING PHASE ERROR DETECTION IN A CONTROLLED DELAY LINE

(71) Applicant: QUALCOMM Incorporated, San Diego, CA (US)

(72) Inventor: Bo Sun, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/436,930

(22) Filed: Feb. 20, 2017

(65) Prior Publication Data

US 2018/0241403 A1    Aug. 23, 2018

(51) Int. Cl.
*H03L 7/06* (2006.01)
*H03L 7/087* (2006.01)
*H03L 7/081* (2006.01)

(52) U.S. Cl.
CPC ............ *H03L 7/087* (2013.01); *H03L 7/0812* (2013.01); *H03L 2207/12* (2013.01)

(58) Field of Classification Search
None
See application file for complete search history.

(56) References Cited

U.S. PATENT DOCUMENTS

| 5,408,200 A | 4/1995 | Buhler |
| 7,034,589 B2 * | 4/2006 | Chao ......................... G06F 1/06 327/149 |
| 8,149,033 B2 | 4/2012 | Yoshizawa et al. |
| 8,258,775 B2 | 9/2012 | Canac |

(Continued)

FOREIGN PATENT DOCUMENTS

| EP | 1223704 A2 | 7/2002 |
| JP | 5633270 B2 | 12/2014 |

OTHER PUBLICATIONS

Hsieh, Min-Han et al., "A 2—8 GHz Multi-Phase Distributed DLL Using Phase Insertion in 90 nm," 2012 IEEE International Symposium on Circuits and Systems (ISCAS), May 20-23, 2012, IEEE, pp. 2015-2018.

(Continued)

*Primary Examiner* — Lincoln D Donovan
*Assistant Examiner* — Khareem E Almo
(74) *Attorney, Agent, or Firm* — Withrow & Terranova, PLLC (57) ABSTRACT

Multi-phase clock generation employing phase error detection between multiple delay circuit outputs in a controlled delay line to provide error correction is disclosed. A multi-phase clock generator is provided that includes a controlled delay line and a phase error detector circuit. Tap nodes are provided from outputs of one or more delay circuits in the controlled delay line. To detect and correct for phase errors in the controlled delay line, a phase detection circuit is provided that includes at least two phase detectors each configured to measure a phase offset error between tap nodes from the delay circuit(s) in the controlled delay line. These phase errors are then combined to create an error correction signal, which is used to control the delay of the delay circuit(s) in the controlled delay line to lock the phase of the output of the final delay circuit to an input reference clock signal.

24 Claims, 10 Drawing Sheets

(56) References Cited

U.S. PATENT DOCUMENTS

| | | | |
|---|---|---|---|
| 8,442,178 B2* | 5/2013 | Kim | H03L 7/0891 |
| | | | 327/144 |
| 8,565,008 B2 | 10/2013 | Harrison | |
| 9,553,594 B1* | 1/2017 | Gupta | H03L 7/091 |
| 2009/0184741 A1 | 7/2009 | Suda et al. | |
| 2009/0243677 A1* | 10/2009 | Becker | G11C 7/22 |
| | | | 327/158 |
| 2009/0295441 A1* | 12/2009 | Kwak | H03L 7/0805 |
| | | | 327/158 |
| 2009/0295442 A1* | 12/2009 | Kwak | G06F 1/06 |
| | | | 327/158 |
| 2015/0004919 A1* | 1/2015 | Ek | H03L 7/087 |
| | | | 455/75 |
| 2016/0241251 A1* | 8/2016 | Kim | H03L 7/0891 |
| 2016/0269012 A1* | 9/2016 | Takahashi | H03K 5/1534 |
| 2016/0373117 A1* | 12/2016 | Josefsberg | H03L 7/085 |
| 2017/0099057 A1* | 4/2017 | Josefsberg | H03L 7/07 |
| 2017/0244545 A1* | 8/2017 | Tsunoda | H03L 7/0807 |
| 2017/0346471 A1* | 11/2017 | Takahashi | G11C 7/222 |

OTHER PUBLICATIONS

Hsiao, Keng-Jan et al., "An 8-GHz to 10-GHz Distributed DLL for Multiphase Clock Generation," IEEE Journal of Solid-State Circuits, vol. 44, No. 9, Sep. 2009, IEEE, pp. 2478-2487.

International Search Report and Written Opinion for PCT/US2018/012074, dated May 16, 2018, 14 pages.

International Preliminary Report on Patentability for International Patent Application No. PCT/US2018/012074, dated Feb. 8, 2019, 18 pages.

* cited by examiner

MULTI-PHASE CLOCK GENERATION EMPLOYING PHASE ERROR DETECTION IN A CONTROLLED DELAY LINE

BACKGROUND

I. Field of the Disclosure

The technology of the disclosure relates generally to multiple-phase (multi-phase) clocks that generate multiple clock signals offset in phases and, more particularly, to phase error detection and correction of multi-phase clock signals.

II. Background

Computing devices have become increasingly common in modern society. The abundance of these devices may be attributed, in part, to the myriad functions such devices provide and the speed with which such functions are provided. The speed with which functions are accomplished is based, in part, on the speed of clocks used to drive the timing of synchronous circuitry. Different frequencies of clock signals can drive circuits to control their speed of operation. Multiple (multi-) phase clocks including multiple clock signals offset in phases are also useful in many applications. For example, in high-speed serial link applications, multi-phase clocks can be used to process data streams at a bit rate higher than internal clock frequencies. As another example, in wideband wireless communication systems like a software-defined radio, multi-phase clocks can be used for canceling unwanted harmonics and sidebands without using filters. As another example, multi-phase clocks can be used in time-interleaved analog-to-digital converter (ADC) circuits to provide precise phases for optimal sampling to improve signal-to-noise ratio (SNR). As yet another example, multi-phase clocks can be used to provide multi-phase local oscillators for radio frequency (RF) modulation and frequency conversion.

SUMMARY OF THE DISCLOSURE

Conventional multi-phase clock generation circuits that generate multi-phase clock signals are accomplished with frequency dividers, phase interpolation, phase locked loops (PLLs), and/or delay-locked loops (DLLs). With clock frequencies in the megahertz (MHz) range and even up into the low gigahertz (GHz) range, conventional multi-phase clock generation circuits provided acceptable performance, but as clock speeds are moving into the millimeter range (e.g., around 30 GHz), traditional designs have become less acceptable. For example, frequency dividers need high-frequency clock sources and consume relatively large amounts of power. Given the power constraints of some mobile computing devices, such power use is an unacceptable design tradeoff. Phase interpolation has a limited range, and its accuracy at high frequencies is not sufficiently precise for current designs. PLLs typically use a frequency divider, and thus suffer the same limits that frequency dividers suffer. DLLs use a phase detector and a feedback loop to minimize errors. At high frequencies, detection of the errors is difficult because the errors may be in the low picosecond range.

Current efforts to provide high-frequency (e.g., multiple tens of gigahertz) clocks have focused on DLLs. Error detection is accomplished by lowering the base frequency and using more delay circuits. The low frequency makes error detection easier, and the long chain of delay circuits allows the final combined clock signal to be at the desired high frequency. However, use of large strings of delay circuits consumes valuable space and adds to the power consumption. Thus, there needs to be a way to provide high-frequency multi-phase clocks without incurring the space or power penalties of traditional designs.

Aspects disclosed herein include multi-phase clock generation employing phase error detection between multiple delay circuit outputs in a controlled delay line to provide error correction. In exemplary aspects disclosed herein, a multi-phase clock generator is provided that includes a controlled delay line and a phase error detector circuit. As an example, the multi-phase clock generator can provide a multi-phase clock for use in millimeter wave frequency ranges while having a relatively small footprint and consuming relatively low amounts of power. The controlled delay line is configured to receive a reference clock signal. The controlled delay line includes at least one delay circuit to delay a preceding input signal to generate a plurality of phase-shifted clock signals. Tap nodes are provided from outputs of the delay circuit(s), any number of which can be combined to form a combined, multi-phase clock output signal. To detect and correct for phase errors in the controlled delay line, a phase detection circuit is provided that includes at least two phase detectors each configured to measure a phase offset error between tap nodes from the delay circuit(s) in the controlled delay line. These phase errors are then combined to create an error correction signal, which is used to control the delay of the delay circuit(s) in the controlled delay line to lock the phase of the output of the final delay circuit to the input reference clock signal. In an exemplary aspect, the tap nodes to be used in the phase error detection are determined by selecting at least two tap nodes having non-adjacent phase shifts. Further, a direct current (DC) offset may be reduced by combining the phase errors.

In one aspect, a multi-phase clock generator is disclosed. The multi-phase clock generator includes a delay circuit. The delay circuit includes a clock input and at least two clock signal outputs. The multi-phase clock generator also includes at least two phase detectors, each comprising at least two phase signal inputs and an error signal output. One of the at least two phase signal inputs is coupled to at least one of the two clock signal outputs. The multi-phase clock generator also includes a feedback circuit. The feedback circuit includes two inputs coupled to the error signal output of the at least two phase detectors and a delay control signal output configured to output a delay control signal based on a combination of signals received at the two inputs.

In another aspect, a multi-phase clock generator is disclosed. The multi-phase clock generator includes a controlled delay line. The controlled delay line is configured to receive a reference clock signal. The controlled delay line includes a plurality of delay circuits, each configured to delay an input signal based on the reference clock signal, based on a delay control signal to provide a respective unique phase-shifted output signal. The multi-phase clock generator also includes a phase error detector circuit. The phase error detector circuit includes a plurality of phase detectors. Each of the plurality of phase detectors is configured to detect a phase difference between received phase-shifted output signals from the controlled delay line. Each of the plurality of phase detectors is also configured to provide a phase error based on the detected phase difference between the received phase-shifted output signals. The phase error detector circuit also includes a feedback circuit. The feedback circuit is configured to combine detected phase differences from the plurality of phase detectors. The feedback circuit is also configured to provide the delay control signal to the plurality of delay circuits based on a combination of the detected phase differences.

In another aspect, a method of providing error correction in a multi-phase clock generator is disclosed. The method includes receiving a reference clock signal. The method also includes outputting from a delay circuit a first clock signal and a complement clock signal. The method also includes detecting a phase error associated with at least one of either the first clock signal or the complement clock signal with a first phase detector. The method also includes summing phase errors from the first phase detector and second phase detector. The method also includes providing a control signal to the delay circuit based on the summing.

DETAILED DESCRIPTION

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include multi-phase clock generation employing phase error detection between multiple delay circuit outputs in a controlled delay line to provide error correction. In exemplary aspects disclosed herein, a multi-phase clock generator is provided that includes a controlled delay line and a phase error detector circuit. As an example, the multi-phase clock generator can provide a multi-phase clock for use in millimeter wave frequency ranges while having a relatively small footprint and consuming relatively low amounts of power. The controlled delay line is configured to receive a reference clock signal. The controlled delay line includes at least one delay circuit to delay a preceding input signal to generate a plurality of phase-shifted clock signals. Tap nodes are provided from outputs of the delay circuit(s), any number of which can be combined to form a combined, multi-phase clock output signal. To detect and correct for phase errors in the controlled delay line, a phase detection circuit is provided that includes at least two phase detectors each configured to measure a phase offset error between tap nodes from the delay circuit(s) in the controlled delay line. These phase errors are then combined to create an error correction signal, which is used to control the delay of the delay circuit(s) in the controlled delay line to lock the phase of the output of the final delay circuit to the input reference clock signal. In an exemplary aspect, the tap nodes to be used in the phase error detection are determined by selecting at least two tap nodes having non-adjacent phase shifts. Further, a direct current (DC) offset may be reduced by combining the phase errors.

Figure 1A:
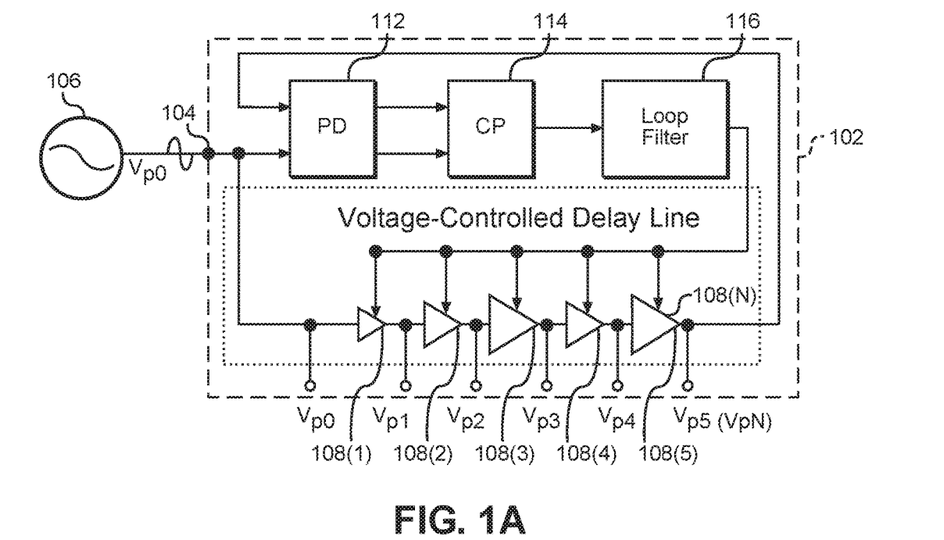
FIG. 1A is a block diagram of an exemplary conventional multi-phase clock generation circuit that includes a delay locked loop (DLL) circuit configured to control a phase offset in a controlled delay line to correct for phase error in the controlled delay line.
Figure 1B:
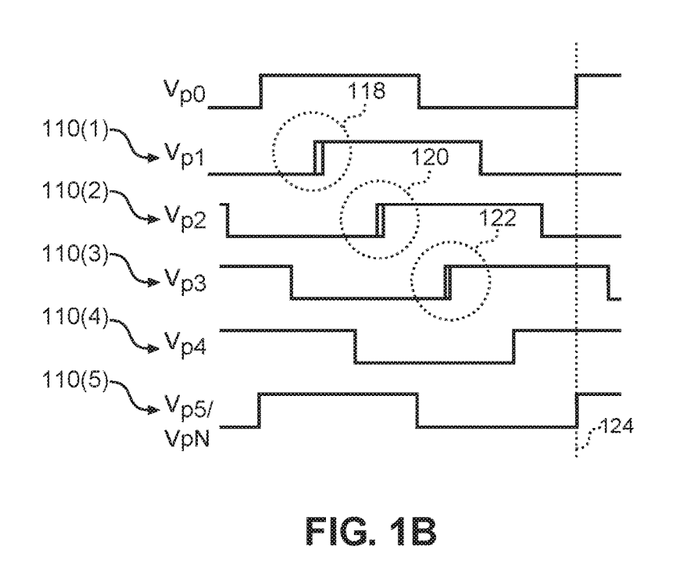
FIG. 1B is a timing diagram of various signals output from the DLL circuit of FIG. 1A.

Before addressing aspects of the present disclosure, a brief overview of conventional multi-phase clock generation is provided with reference to FIGS. 1A-1D. Discussion of exemplary aspects of the present disclosure begins below with reference to FIG. 2. In this regard, FIG. 1A is a block diagram of a conventional multi-phase clock generator 100 that includes a delay-locked loop (DLL) circuit 102. The DLL circuit 102 includes a reference clock input 104 that receives a reference clock signal Vp0 from a reference clock 106. The reference clock signal Vp0 is provided to a first one of a series of delay circuits 108(1)-108(N). As illustrated, 'N' is five (5), but it should be appreciated that more or fewer of the delay circuits 108(1)-108(N) may be used as needed or desired. As the reference clock signal Vp0 propagates through the series of delay circuits 108(1)-108(N), the reference clock signal Vp0 is progressively delayed more as illustrated in FIG. 1B. Each of the delay circuits 108(1)-108(N) has an associated tap node 110(1)-110(N) that provides access to the progressively delayed reference clock signal output by a respective delay circuit 108(1)-108(N). The output of a last delay circuit 108(N) is provided to a phase detector (referenced as "PD" in the drawings) 112. The phase detector 112 also receives the reference clock signal Vp0 and compares the output of the last delay circuit 108(N) to the reference clock signal Vp0 to generate an error signal.

The error signal is provided to a charge pump (referenced as "CP" in the drawings) 114. The output of the charge pump 114 is filtered by a loop filter 116 and is used to control the delay circuits 108(1)-108(N).

Figure 1C:
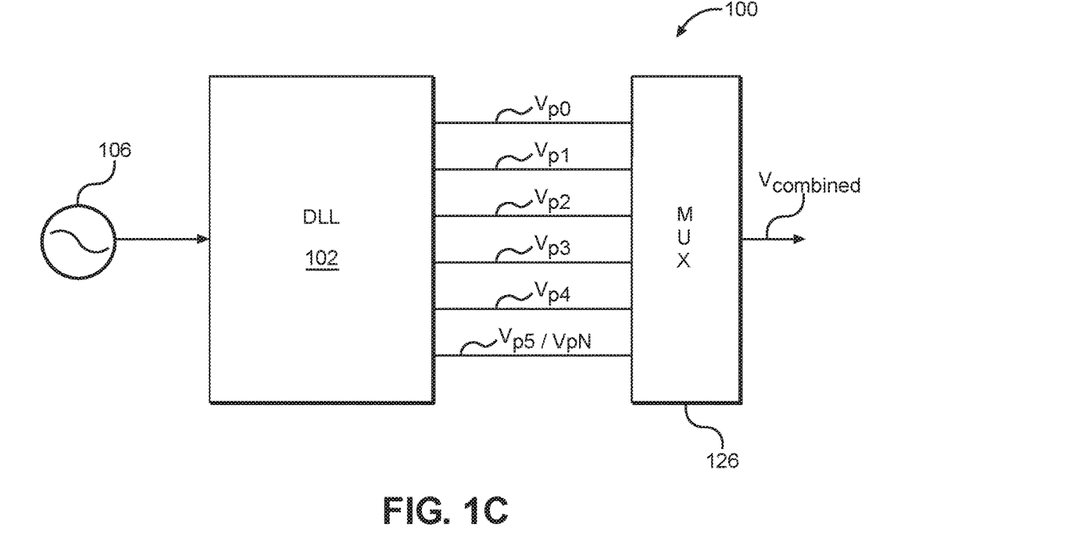
FIG. 1C is a block diagram of an exemplary combinatorial circuit to produce a multi-phase clock output signal using the DLL circuit of FIG. 1A.
Figure 1D:
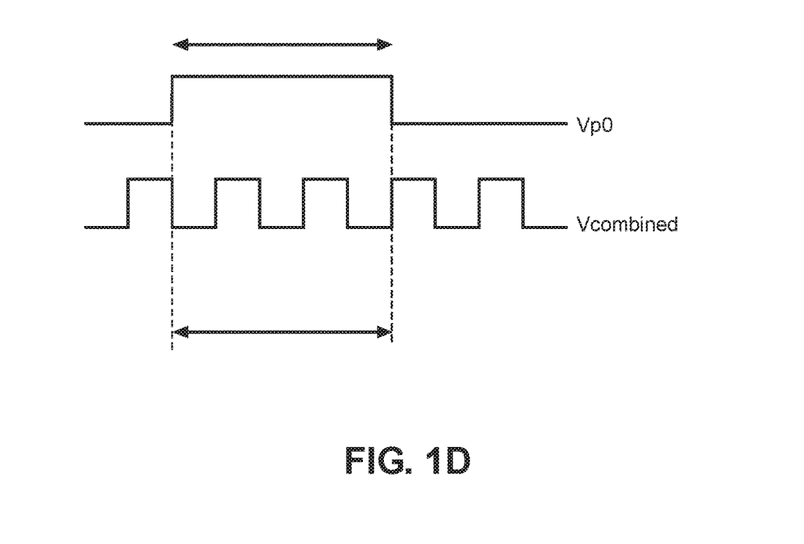
FIG. 1D is a time diagram comparing the combined multi-phase clock output signal of FIG. 1C to the input of the DLL circuit of FIG. 1A.

As noted, each of the delay circuits 108(1)-108(N) has an associated tap node 110(1)-110(N) that provides access to a respective delayed clock signal Vp1-VpN. The various delayed clock signals Vp1-VpN are illustrated in FIG. 1B with the associated tap nodes 110(1)-110(N) indicated on the left. Each of the delay circuits 108(1)-108(N) may have process variations which introduce jitter such as jitter 118, 120, and 122 into the delayed clock signals Vp1-VpN. The error signal from the loop filter 116 is used to minimize this jitter so that the last delayed clock signal VpN is aligned with the reference clock signal Vp0 (see generally line 124, which shows the last delayed clock signal VpN aligned with the reference clock signal Vp0). The delayed clock signals Vp1-VpN may be combined to form a multi-phase clock signal. As illustrated in FIG. 1C, the outputs of the tap nodes 110(1)-110(N) may be provided to a multiplexer (MUX) 126, which may output a combined clock signal Vcombined. Each rising or falling edge amongst the various delayed clock signals Vp1-VpN causes a corresponding clock transition in the combined clock signal Vcombined as better illustrated in FIG. 1D.

In practice, at high frequencies (e.g., over 10 gigahertz (GHz)), the error at the last tap node may be relatively small (on the order of a few picoseconds). While the error is small in absolute terms, the error is large in relative terms where even a few picoseconds can be a significant percentage of the total period of the combined clock signal. However, because the error is so small in absolute terms, it can be difficult to detect at the phase detector 112. Conventional approaches add delay circuits to the series of delay circuits 108(1)-108(N) and slow down the reference clock 106. Error is easier to detect using a slow reference clock because the frequency of the last delayed clock signal VpN is also relatively slow, which means that cumulative error in the last delayed clock signal VpN is not likely to be in the picosecond range. The addition of more delay circuits increases the number of transitions applied when forming the combined clock signal Vcombined, which in turn increases the frequency of the combined clock signal Vcombined. The addition of more delay circuits may solve the frequency requirements and the error detection requirements, but each added delay circuit increases the physical size of the DLL circuit 102 and has its own power requirements. Mobile computing devices are under pressure to minimize circuit size and reduce power consumption to improve battery performance.

Exemplary aspects of the present disclosure allow high-frequency multi-phase clock generation without long chains of delay circuits or excessive power consumption. In particular, exemplary aspects of the present disclosure use the delay circuit(s) to generate a delayed clock signal and a complement delayed clock signal. As used herein, the complement or complementary signal is 180 degrees shifted from the signal for which it is a complement. Thus, for example, if a base signal is shifted 120 degrees by a delay circuit, the complement would be at 300 degrees. One or more of these generated signals are combined with the reference clock signal or other delayed signals in a phase detector to generate two intermediate error signals. The intermediate error signals are combined in a circuit to generate a control signal. The control signal is filtered and used to control the delay circuit(s). In an exemplary aspect, the combining is summing. The summing of the two signals causes the respective direct current (DC) components of the intermediate error signals to cancel each other.

Figure 2:
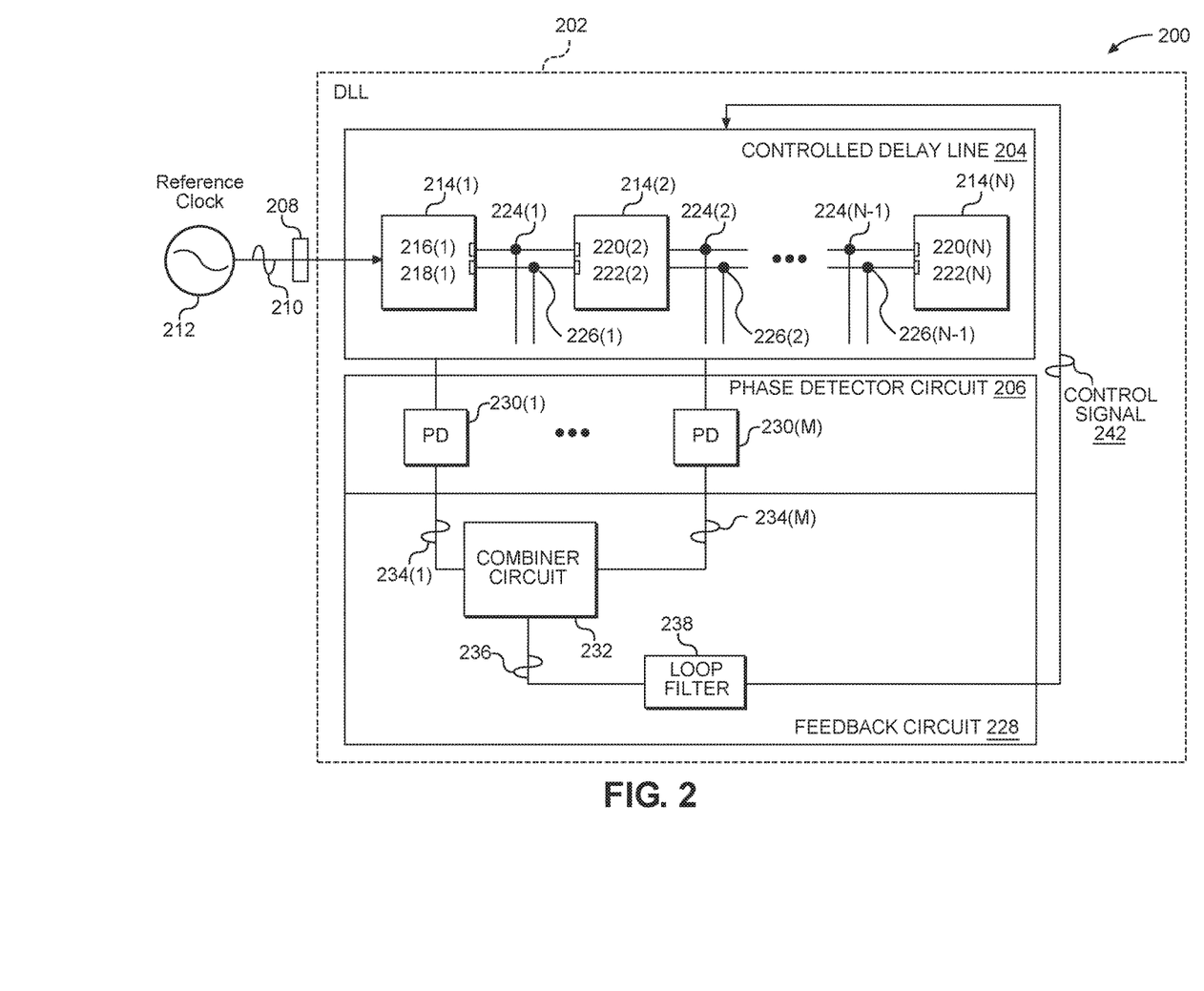
FIG. 2 is a block diagram of a generalized multi-phase clock generation circuit with phase error detection and correction according to an exemplary aspect of the present disclosure.

A generalized block diagram of a multi-phase clock generator 200 is provided with reference to FIG. 2. The multi-phase clock generator 200 includes a DLL circuit 202 that includes a controlled delay line 204 and a phase error detector circuit 206. The DLL circuit 202 has an input 208 configured to receive a reference clock signal 210 from a reference clock 212. The reference clock signal 210 is provided from the input 208 to the controlled delay line 204. The controlled delay line 204 includes one or more delay circuits 214(1)-214(N) that progressively delay the reference clock signal 210. Each of the delay circuits 214(1)-214(N) has two respective outputs 216(1)-216(N) and 218(1)-218(N) as well as two inputs 220(1)-220(N) and 222(1)-222(N). The delay circuits 214(1)-214(N) are serially arranged, such that outputs 216(1) and 218(1) of a first delay circuit 214(1) are coupled to inputs 220(2) and 222(2) of a second delay circuit 214(2) and so on until outputs 216(N−1) and 218(N−1) are coupled to inputs 220(N) and 222(N). Tap nodes 224(1)-224(N−1) and 226(1)-226(N−1) couple to the respective outputs 216(1)-216(N−1) and 218(1)-218(N−1).

With continued reference to FIG. 2, the phase error detector circuit 206 includes a feedback circuit 228 and a plurality of phase detectors 230(1)-230(M), where 'M' is an integer greater than or equal to two (2). The feedback circuit 228 includes a combiner circuit 232 which combines output signals 234(1)-234(M) from the plurality of phase detectors 230(1)-230(M) to create an error correction signal 236, which is filtered by a loop filter 238. The loop filter 238 outputs a control signal 242, which controls the delay circuits 214(1)-214(N) within the controlled delay line 204. One or more charge pumps (not illustrated) may be associated with respective phase detectors 230(1)-230(M).

Exemplary aspects of the present disclosure select at least two different ones of the signals at the tap nodes 224(1)-224(N−1) and 226(1)-226(N−1) to provide to the plurality of phase detectors 230(1)-230(M). Such signals are likely to be out of phase with the reference clock signal 210 and out of phase with one another. By comparing multiple such signals with the plurality of phase detectors 230(1)-230(M) and combining the output signals 234(1)-234(M), even small errors (e.g., in the picosecond range) are detectable and able to be corrected with the control signal 242.

While described as a multi-phase clock generator 200 with a DLL circuit 202, it should be appreciated that the multi-phase clock generator 200 could be incorporated into a DLL circuit, used as a frequency divider, or incorporated into a transceiver and more particularly incorporated into a wireless transceiver such as a millimeter wireless transceiver.

Figure 3:
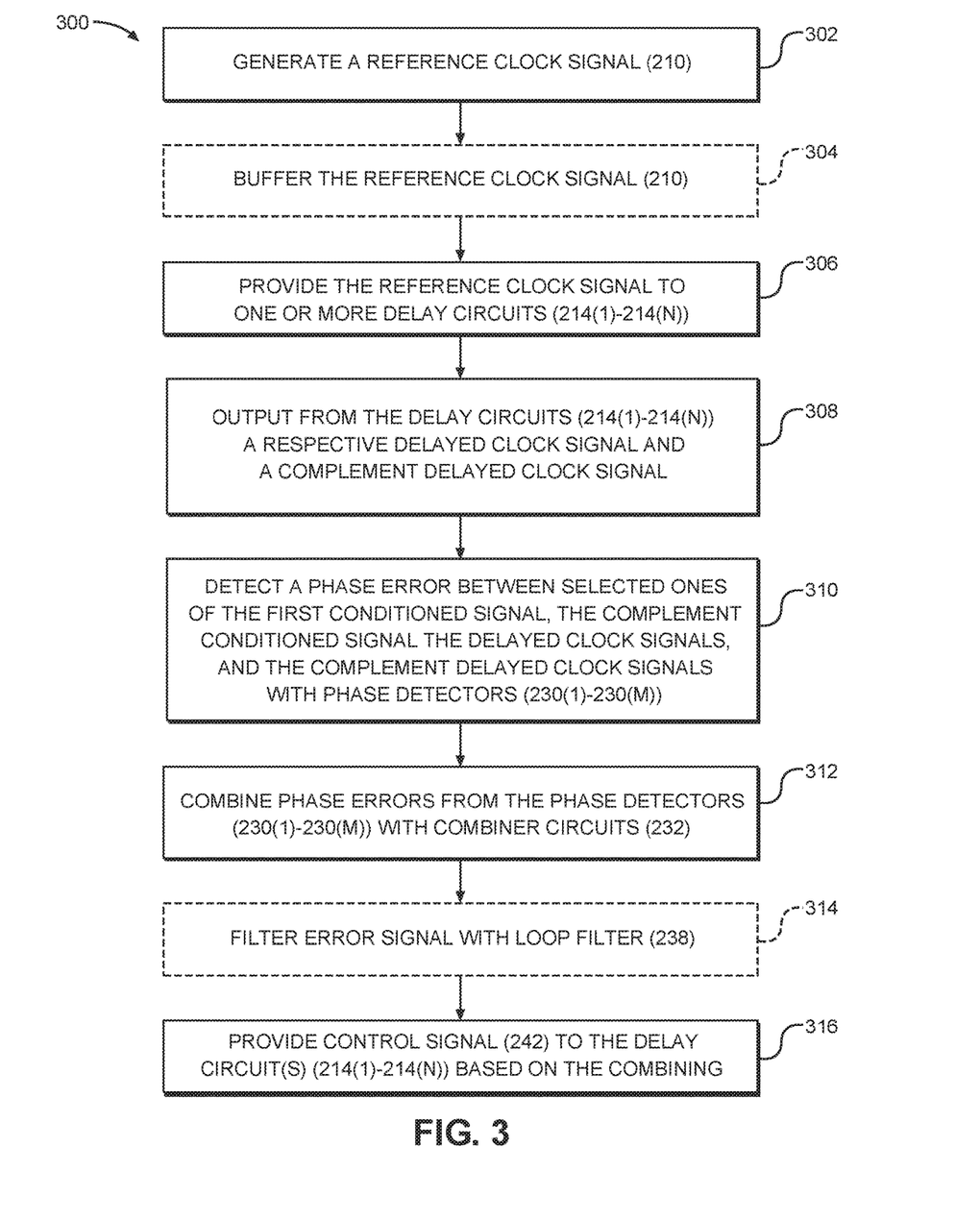
FIG. 3 is a flowchart illustrating an exemplary process for using the generalized multi-phase clock generation circuit of FIG. 2.

A process 300 of using the multi-phase clock generator 200 of FIG. 2 is illustrated in FIG. 3. The process 300 begins with generating a reference clock signal 210 (block 302) with the reference clock 212 and providing the reference clock signal 210 to the input 208 of the DLL circuit 202. The controlled delay line 204 receives the reference clock signal 210 from the input 208, and the reference clock signal 210 may be provided to a buffer circuit (not illustrated), which buffers the reference clock signal 210 (block 304). Note that the buffer circuit is optional, but may be used to condition the reference clock signal 210 and/or provide a first conditioned signal and a complement conditioned signal. In an exemplary aspect, the reference clock signal 210 (or the conditioned signals) is provided to one or more delay circuits 214(1)-214(N) (block 306). Each of the one or more delay circuits 214(1)-214(N) outputs a respective delayed clock signal and a complement delayed clock signal (block 308). Tap nodes 224(1)-224(N−1) are used to bring selected ones of the first conditioned signal, and/or the delayed clock signals to at least two phase detectors 230(1)-230(M), while tap nodes 226(1)-226(N−1) are used to bring selected ones of the complement conditioned signal and/or the complement delayed clock signals to the at least two phase detectors 230(1)-230(M). The phase detectors 230(1)-230(M) are used to detect a phase error between the selected ones of the first conditioned signal, the complement conditioned signal, the delayed clock signals, and the complement delayed clock signals (block 310). The phase errors generated by the at least two phase detectors 230(1)-230(M) are combined by the combiner circuit 232 (block 312) and an error signal is output from the combiner circuit 232. The error signal is filtered with a loop filter 238 (block 314), and a control signal 242 generated. The control signal 242 is provided to the delay circuit(s) 214(1)-214(N) based on the combining (block 316).

Figure 4A:
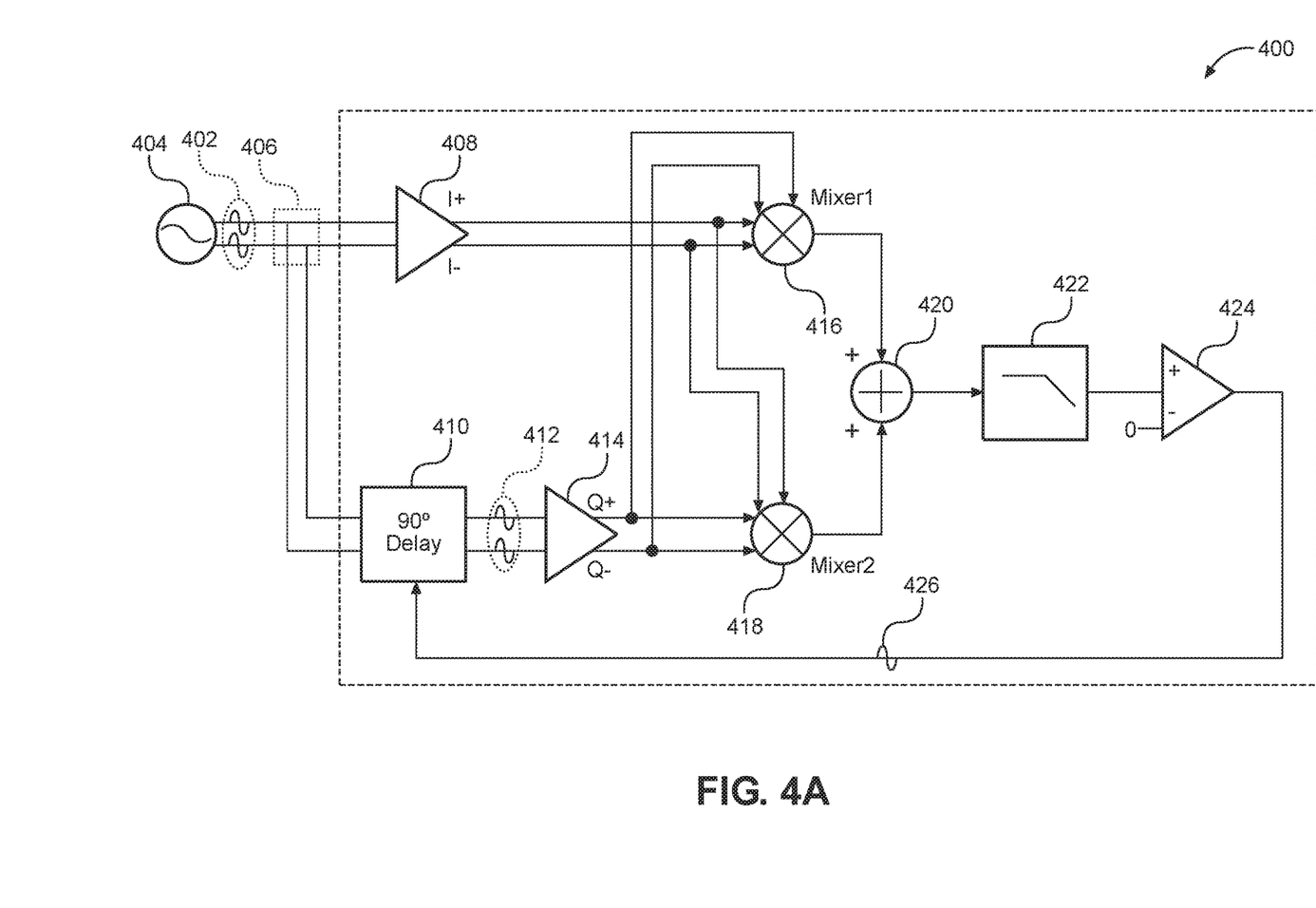
FIG. 4A is a block diagram of an exemplary multi-phase clock generation circuit that employs phase error detection between multiple delay circuit outputs in the form of an I/Q multi-phase clock generator.

While it is expected that most implementations will use a plurality of the delay circuits 214(1)-214(N) (i.e., 'N' is greater than one (1)), there is a use case where 'N' is one (1). Thus, in a first exemplary aspect, a single 90 degree delay circuit is used to create I and Q signals, which are all used to generate a control signal. In this regard, FIG. 4A illustrates a multi-phase clock generator 400 that employs phase error detection between multiple outputs of a single delay circuit for correcting phase error in a controlled delay line. The multi-phase clock generator 400 is configured to receive a reference clock signal 402 from a reference clock 404. As illustrated, the reference clock signal 402 is a differential clock signal. The multi-phase clock generator 400 includes a reference clock input 406 that receives the reference clock signal 402. The reference clock signal 402 is provided to an inverter 408 that provides a positive I signal and a negative I signal at respective outputs. The reference clock signal 402 is also provided to a 90 degree delay circuit 410 which outputs a delayed reference clock signal 412. The delayed reference clock signal 412 is provided to a second inverter 414 that provides a positive Q signal and a negative Q signal at respective outputs. The positive I, negative I, positive Q, and negative Q signals are provided to both a first mixer 416 and a second mixer 418. The mixers 416 and 418 act as phase detectors. The mixers 416 and 418 are coupled to a summing circuit 420 and provide respective error signals to the summing circuit 420. The summing circuit 420 acts as a combiner circuit. The output of the summing circuit 420 is filtered by a low pass filter 422, which controls an amplifier 424. The amplifier 424 provides a control signal 426 to the 90 degree delay circuit 410. Collectively, the summing circuit 420, the low pass filter 422, and the amplifier 424 form a feedback circuit, and the control signal 426 is a delay control signal based on the sum of detected phase differences. Note that in some aspects, the low pass filter 422 and/or the amplifier 424 may be removed or replaced by other circuitry, such as a charge pump (not illustrated). The delay control signal drives the error signals to zero (0) such that the DLL circuit of the multi-phase clock generator 400 is "locked." It should further be appreciated, that as used herein, the feedback circuit and the mixers 416 and 418 form a phase error detector circuit.

In this use case where 'N' is one (1), all the outputs from the delay circuit 410 and the outputs of the inverter 408 are used by the mixers 416 and 418 to determine the phase error of the signals.

Figure 4B:
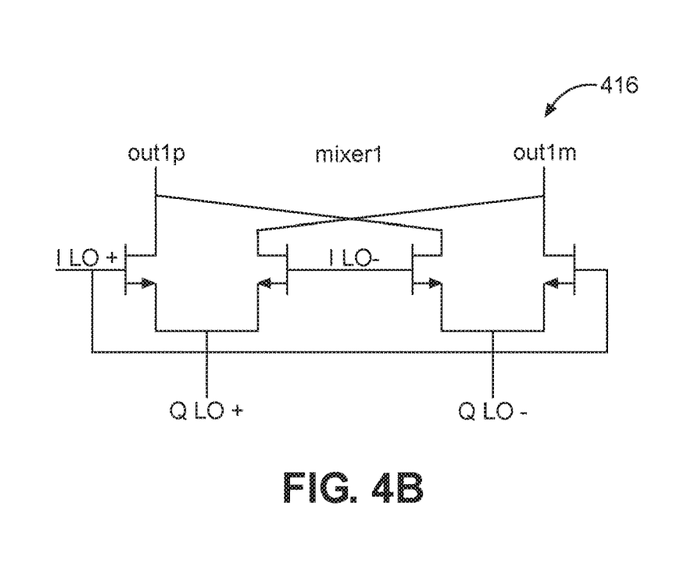
FIG. 4B is an expanded circuit diagram of one of the phase detectors of FIG. 4A including showing inputs from delay circuits.
Figure 4C:
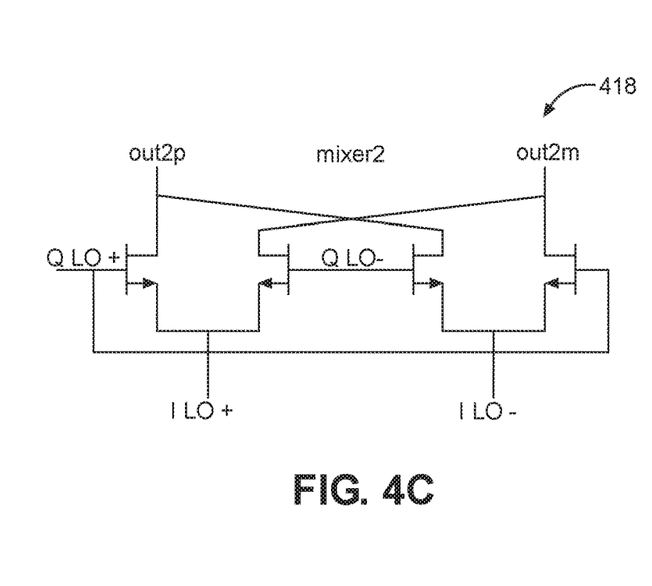
FIG. 4C is an expanded circuit diagram of the other one of the phase detectors of FIG. 4A including showing the inputs from the delay circuits.

The inputs of the mixers 416 and 418 are illustrated in FIGS. 4B and 4C, respectively. The use of the two mixers 416 and 418 solves the DC offset by reducing the DC component that that would otherwise be present with a single mixer. While the mixers 416 and 418 are, in fact, mixers, it should be appreciated, that when used as described, the mixers 416 and 418 function as phase detectors which detect a phase difference between received phase-shifted signals.

The multi-phase clock generator 400 is a special case for I/Q signals, but the present disclosure is not so limited. Other multi-phase clock generation is also contemplated which may have more phase delays to increase the frequency of the reference clock to a desired frequency (e.g., 30 GHz). As noted above, exemplary aspects of the present disclosure allow high-frequency multi-phase clock generation without long chains of delay circuits or excessive power consumption. In particular, exemplary aspects of the present disclosure may use multiple delay circuits to generate a plurality of delayed clock signals and a plurality of complement delayed clock signals. Some of these signals are combined with the reference clock signal or other delayed signals in a phase detector to generate two intermediate error signals. The intermediate error signals are combined in a circuit to generate a control signal. The control signal is filtered and used to control the delay circuits. In an exemplary aspect, the combining is summing. The summing of the two signals causes the respective DC components of the intermediate error signals to cancel each other.

Figure 5:
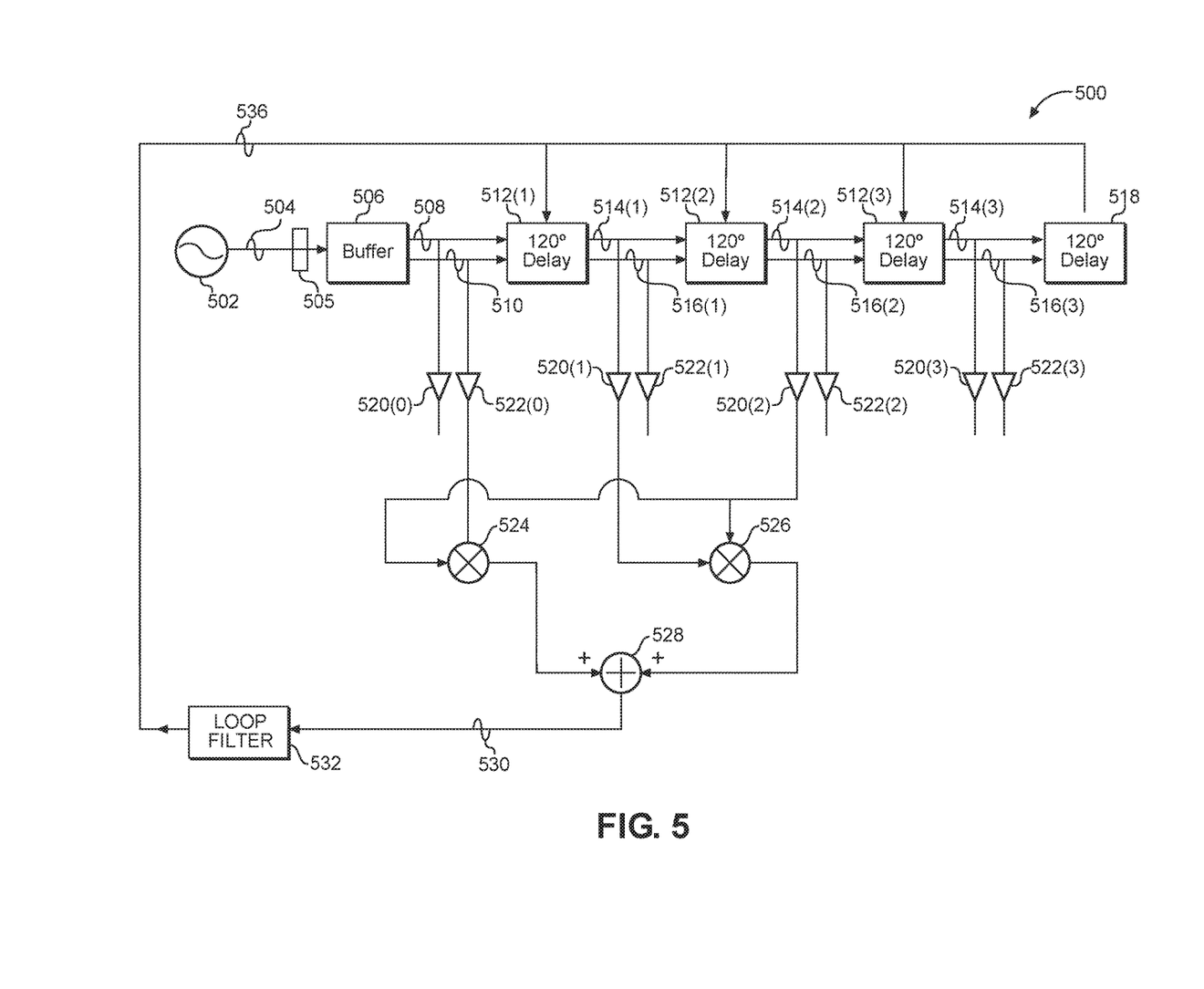
FIG. 5 is a block diagram of an exemplary multi-phase clock generation circuit that employs phase error detection between multiple delay circuit outputs from four delay circuits.

In this regard, FIG. 5 illustrates a three-phase multi-phase clock generator 500. The multi-phase clock generator 500 is associated with a reference clock 502 that provides a reference clock signal 504 to an input 505 of the multi-phase clock generator 500. The input 505 is coupled to a buffer circuit 506 that may generate a first clock signal 508 and a complement clock signal 510, which are output and passed to an input of a controlled delay line formed from a plurality of delay circuits 512(1)-512(N). In this exemplary aspect, N is three. Each of the delay circuits 512(1)-512(3) includes inputs and outputs its corresponding delayed clock signal 514(1)-514(3) and its corresponding complement delayed clock signal 516(1)-516(3). It should be appreciated that each of the delayed clock signals 514(1)-514(3) and complement delayed clock signals 516(1)-516(3) are unique phase-shifted output signals from the respective delay circuits 512(1)-512(3). In this exemplary aspect, each of the delay circuits 512(1)-512(3) delays the clock signal by 120 degrees to provide the respective unique phase-shifted output signals. Thus, the delay circuits 512(1)-512(3) are uniform delay circuits (i.e., each of the delay circuits 512(1)-512(3) delays the clock signal by the same amount). A final load balancing delay circuit 518 is provided coupled to the output of a last delay circuit 512(3). The structure of the final load balancing delay circuit 518 is identical to the structure of the delay circuits 512(1)-512(3). Likewise, the structure of the buffer circuit 506 may be identical to the structure of the delay circuits 512(1)-512(3) so that the inputs and outputs of the delay circuits 512(1)-512(3) all experience the same load.

Tap nodes 520(0)-520(3) couple to the outputs of the buffer circuit 506 and the delay circuits 512(1)-512(3), respectively. Thus, tap node 520(0) carries the reference clock signal 504; tap node 520(1) carries a first delayed clock signal 514(1) (e.g., delayed 120 degrees); tap node 520(2) carries a second delayed clock signal 514(2) (e.g., delayed 240 degrees); and tap node 520(3) carries a third delayed clock signal 514(3) (e.g., delayed 360 degrees).

Similarly, tap nodes 522(0)-522(4) are coupled to the complementary outputs of the buffer circuit 506 and the delay circuits 512(1)-512(3), respectively. Thus, tap node 522(0) carries the complement of the reference clock signal 504; tap node 522(1) carries a first complement delayed clock signal 516(1) (e.g., 300 degrees); tap node 522(2) carries a second complement delayed clock signal 516(2) (e.g., 60 degrees); and tap node 522(3) carries a third complement delayed signal 516(3) (e.g., 180 degrees).

Selected ones of the tap nodes 520(0)-520(3) and 522(0)-522(3) are combined by mixer 524 and mixer 526. The mixer 524 and the mixer 526 are effectively phase detectors that detect a phase difference between received phase-shifted signals. Thus, the mixer 524 and the mixer 526 each have two phase signal inputs (not labeled) that receive selected phase-shifted signals from the delay circuits 512(1)-512(3) and an error signal output (not labeled). The signals at the outputs of the mixer 524 and the mixer 526 represent error signals and are provided to a summing circuit 528, which outputs an error correction signal 530. The error correction signal 530 is filtered by a loop filter 532. Collectively, the summing circuit 528 and the loop filter 532 form a feedback circuit. The loop filter 532 has a delay control output (not labeled) that outputs a control signal 536 that controls the delay circuits 512(1)-512(3). This control signal 536 is thus a delay control signal that controls the delay circuits 512(1)-512(3) to generate the respective unique phase-shifted output signals. Note that, collectively, the feedback circuit and the mixers 524 and 526 form a phase error detector circuit. As with the multi-phase clock generator 200 of FIG. 2, the loop filter 532 may be replaced with other circuitry, such as an amplifier, as needed or desired.

Selection of the tap nodes 520(0)-520(3) and 522(0)-522(3) to use with the mixers 524 and 526 is done at the time of circuit design and is done so with the following concepts in mind. Assuming that each delay circuit 512(1)-512(N) introduces identical error ($\delta$), after the first delay circuit 512(1), the error is $1*\delta$, after the second delay circuit 512(2), the error is $2*\delta$, and after delay circuit 512(N), the error is $N*\delta$. When a mixer, such as the mixer 524, receives output from adjacent delay circuits, e.g., from the tap nodes 520(1) and 520(2), the output of the mixer 524 is a direct current (DC) component and an error term $1*\delta$. If the mixer receives output from delay circuits that are spaced apart, the output of the mixer is the DC component and an error component equal to the uniform error multiplied by the difference in position (e.g., 512(1) and 512(3) would have $2*\delta$ (i.e., the third delay circuit minus the first delay circuit is 2). Thus, as illustrated, the mixer 524 receives the signal from the tap node 520(2) (i.e., 240 degrees) and the tap node 522(0) (i.e., 180 degrees), and the output of the mixer 524 is $-1*DC-2*\delta$. Similarly, the mixer 526 receives the signal from the tap node 520(1) (i.e., 120 degrees) and the tap node 520(2) (i.e., 240 degrees), and the output of the mixer 526 is $1*DC+1*\delta$. When these two outputs are summed at the summing circuit 528, the output is $-\delta$, which is the error term for the feedback loop. Thus, the inputs of the mixers 524 and 526 may be selected such that when the respective outputs are summed, a single error value $\delta$ is used as the error term for the feedback loop. If the output of the summing circuit 528 is some multiple of $\delta$ greater than one or a fractional $\delta$, the feedback loop gain may be adjusted.

While not illustrated, the signals on the tap nodes 520(0)-520(3) and 522(0)-522(3) may also be provided to a multiplexer (not shown), which then combines the signals to provide a desired clock frequency.

Figure 6:
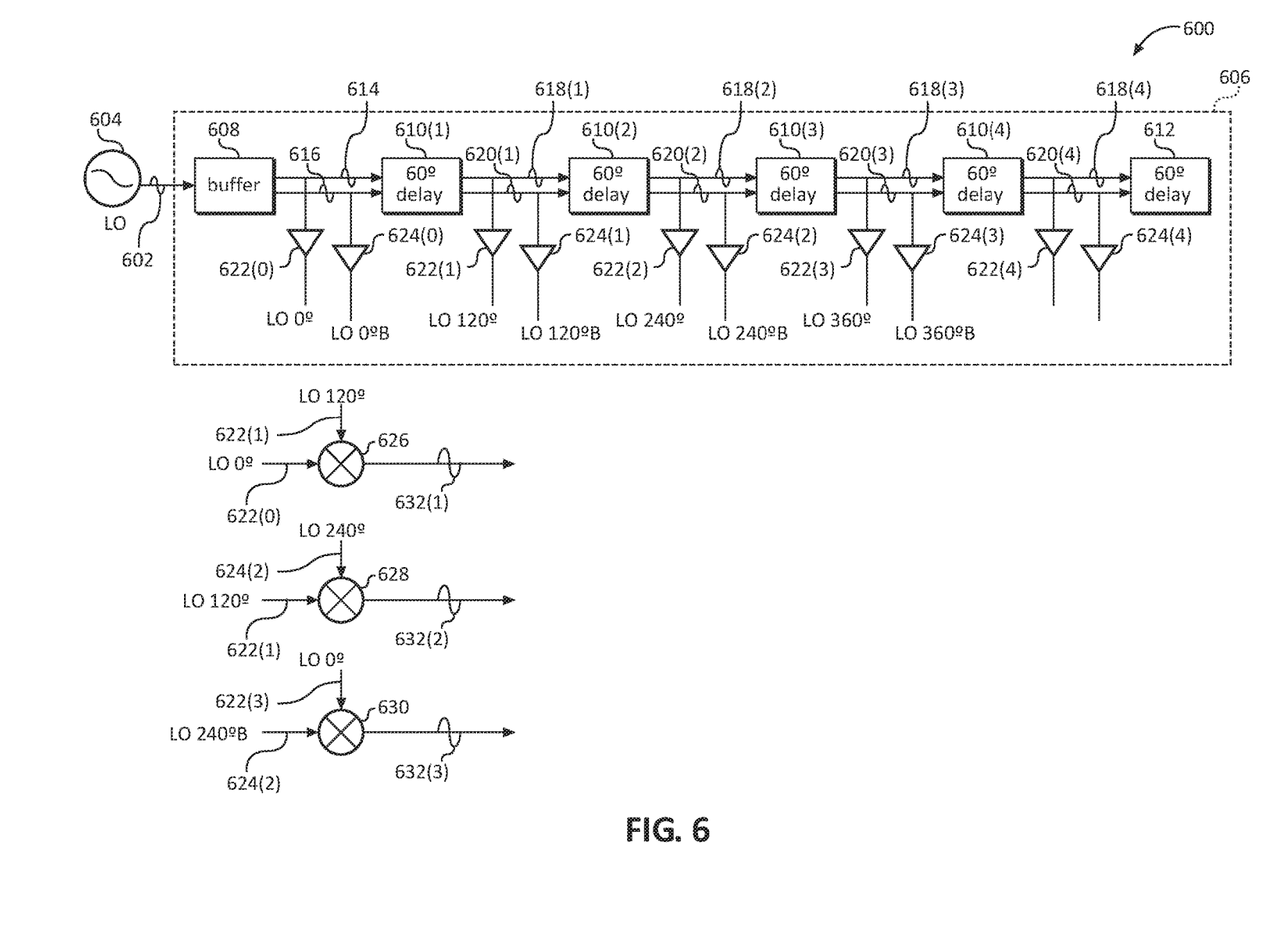
FIG. 6 is a block diagram of another exemplary multi-phase clock generation circuit that employs phase error detection between multiple delay circuit outputs from six delay circuits.

While it is possible to calculate a control signal using just two mixers such as the mixer 524 and the mixer 526, the present disclosure is not so limited. More than two mixers may be used. FIG. 6 illustrates a multi-phase clock generator 600 having more delay circuits and also using cascaded summing of error signals to derive the control signal. In this regard, the multi-phase clock generator 600 receives a reference clock signal 602 from a local oscillator 604 (referenced as "LO" in the drawings). The reference clock signal 602 is provided to a controlled delay line 606. The controlled delay line 606 includes a buffer circuit 608, which is coupled to a series of delay circuits 610(1)-610(M). As illustrated, 'M' is four (4). Note that while only four delay circuits 610(1)-610(4) are used for feedback loop control, additional delay circuits (not illustrated) may be used for all the phase clock outputs. Thus, for example, six delay circuits may be used for all the phase clock outputs if the delay circuits introduce a 60° delay ($\delta*60°=360°$ of delay). A final load balancing delay circuit 612 is provided as well. The buffer circuit 608 outputs a zero phase clock signal 614 and a complement zero phase clock signal 616 to first delay circuit 610(1). The first delay circuit 610(1) delays both signals by its delay value (as illustrated, 120 degrees) and outputs a first delayed clock signal 618(1) and a first complement delayed clock signal 620(1), both of which are passed to a next delay circuit 610(2), which also outputs its corresponding delayed clock signal 618(2) and complement delayed clock signal 620(2). Each of the delay circuits 610(1)-610(M) outputs its corresponding delayed clock signal 618(1)-618(M) and complement delayed clock signal 620(1)-620(M). Tap nodes 622(0)-622(M) are associated with each of the clock signals 614 and 618(1)-618(M), respectively. Similarly, tap nodes 624(0)-624(M) are associated with each of the complement delayed clock signals 616 and 620(1)-620(M), respectively. As used in FIG. 6, the signals from the tap nodes 622(0)-622(M) and 624(0)-624(M) are designated by the phase shift, where B is used to designate the complement. Thus, for example, LO 120° B is shifted to 300 degrees (i.e., the complement of 120 degrees).

With continued reference to FIG. 6, certain ones of the tap nodes 622(0)-622(M) and 624(0)-624(M) are coupled to mixers 626, 628, and 630 which generate respective error signals 632(1)-632(3). As illustrated, error signal 632(1) will be $1*\delta$; error signal 632(2) will be $1*\delta$; and error signal 632(3) will be $-2*\delta$. There is freedom to add or subtract between these error signals 632(1)-632(3) as long as the DC component is canceled and there is still a remaining error term left for the feedback loop to correct the error. For example, the error signals 632(1) and 632(2) may be summed ($2*DC+2*\delta$), while the error signal 632(2) is subtracted from the error signal 632(3) ($-2*DC-3*\delta$). These two intermediate error signals (not shown) may then be summed to provide the error term for the feedback loop ($\delta$), which may be filtered and used to control the delay circuits 610(1)-610(M).

The multi-phase clock generators 200, 400, 500, and 600 as well as permutations on the concepts associated therewith (e.g., varying the number of delay circuits, varying the amount of delay associated with a delay circuit, varying which tap nodes are coupled to the mixers, etc.) are well designed to produce a high-frequency (e.g., 30 GHz) output clock signal with little error while maintaining a small footprint for the DLL circuit by keeping the number of delay circuits minimized. The small number of delay circuits has the further benefit of keeping power consumption at acceptably low levels The multi-phase clock generation employing phase error detection in a controlled delay line according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, a millimeter wave transceiver, and a multicopter.

Figure 7:
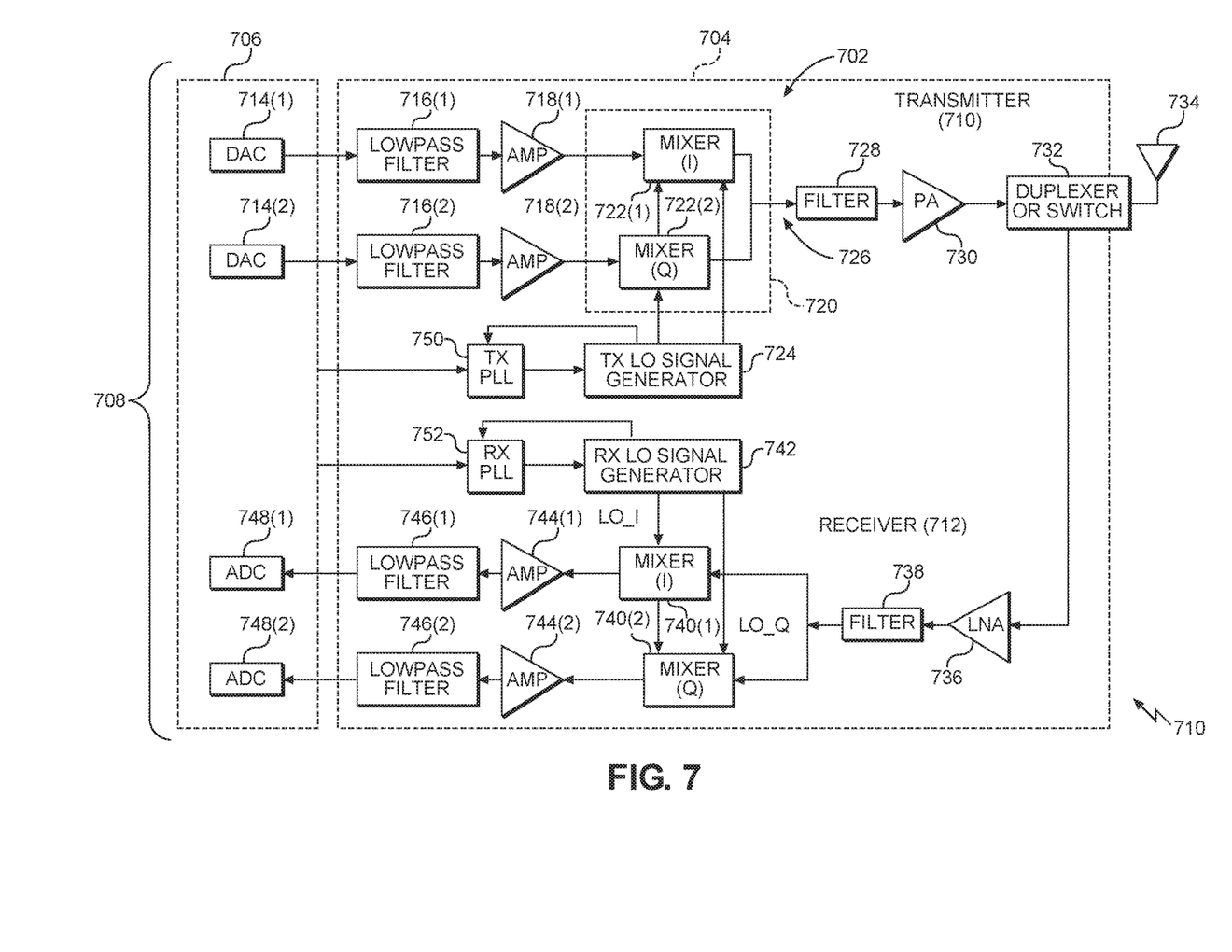
FIG. 7 is a block diagram of an exemplary wireless communications device that includes radio-frequency (RF) components formed in an integrated circuit (IC), that may use one or more clock frequencies generated by a multi-phase clock generation circuit.

FIG. 7 illustrates an example of a wireless communications device 700 that can include multi-phase clock generators such as the multi-phase clock generators 200, 400, 500, or 600 of FIGS. 2, 4A, 5, and 6. In this regard, the wireless communications device 700 may be provided in an integrated circuit (IC) 702. The wireless communications device 700 may include or be provided in any of the above-referenced devices, as examples. As shown in FIG. 7, the wireless communications device 700 includes a transceiver 704, which may be a millimeter wave transceiver. The wireless communication device 700 further includes a data processor 706. The transceiver 704 and/or the data processor 706 may include a graphene-based semiconductor device 708 formed from a semiconductor wafer. The data processor 706 may include a memory (not shown) to store data and program codes. The transceiver 704 includes a transmitter 710 and a receiver 712 that support bi-directional communication. In general, the wireless communications device 700 may include any number of transmitters and/or receivers for any number of communication systems and frequency bands. All or a portion of the transceiver 704 may be implemented on one or more analog ICs, radio frequency (RF) ICs (RFICs), mixed-signal ICs, etc.

A transmitter or a receiver may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the wireless communications device 700 in FIG. 7, the transmitter 710 and the receiver 712 are implemented with the direct-conversion architecture.

In the transmit path, the data processor 706 processes data to be transmitted and provides I and Q analog output signals to the transmitter 710. In the exemplary wireless communications device 700, the data processor 706 includes digital-to-analog-converters (DACs) 714(1) and 714(2) for converting digital signals generated by the data processor 706 into the I and Q analog output signals, e.g., I and Q output currents, for further processing.

Within the transmitter 710, low pass filters 716(1) and 716(2) filter the I and Q analog output signals, respectively, to remove undesired signals caused by the prior digital-to-analog conversion. Amplifiers (referenced as "AMP" in the drawings) 718(1) and 718(2) amplify the signals from the low pass filters 716(1) and 716(2), respectively, and provide I and Q baseband signals. An upconverter 720 upconverts the I and Q baseband signals with I and Q transmit (TX) local oscillator (LO) signals through mixers 722(1) and 722(2) from a TX LO signal generator 724 to provide an upconverted signal 726. A filter 728 filters the upconverted signal 726 to remove undesired signals caused by the frequency upconversion as well as noise in a receive frequency band. A power amplifier (PA) 730 amplifies the upconverted signal 726 from the filter 728 to obtain the desired output power level and provides a TX RF signal. The TX RF signal is routed through a duplexer or switch 732 and transmitted via an antenna 734.

In the receive path, the antenna 734 receives signals transmitted by base stations and provides a received (RX) RF signal, which is routed through the duplexer or switch 732 and provided to a low noise amplifier (LNA) 736. The duplexer or switch 732 is designed to operate with a specific RX-to-TX duplexer frequency separation, such that RX signals are isolated from TX signals. The RX RF signal is amplified by the LNA 736 and filtered by a filter 738 to obtain a desired RF input signal. Downconversion mixers 740(1) and 740(2) mix the output of the filter 738 with I and Q RX LO signals (i.e., LO_I and LO_Q) from an RX LO signal generator 742 to generate I and Q baseband signals. The I and Q baseband signals are amplified by amplifiers 744(1) and 744(2) and further filtered by low pass filters 746(1) and 746(2) to obtain I and Q analog input signals, which are provided to the data processor 706. In this example, the data processor 706 includes analog-to-digital-converters (ADCs) 748(1) and 748(2) for converting the I and Q analog input signals into digital signals to be further processed by the data processor 706.

In the wireless communications device 700 in FIG. 7, the TX LO signal generator 724 generates the I and Q TX LO signals used for frequency upconversion, while the RX LO signal generator 742 generates the I and Q RX LO signals used for frequency downconversion. Each LO signal is a periodic signal with a particular fundamental frequency. A TX phase-locked loop (PLL) circuit 750 receives timing information from the data processor 706 and generates a control signal used to adjust the frequency and/or phase of the TX LO signals from the TX LO signal generator 724. Similarly, a RX PLL circuit 752 receives timing information from the data processor 706 and generates a control signal used to adjust the frequency and/or phase of the RX LO signals from the RX LO signal generator 742. The PLL circuits described above can be replaced by the DLL circuits and multi-phase clock generators described herein.

Figure 8:
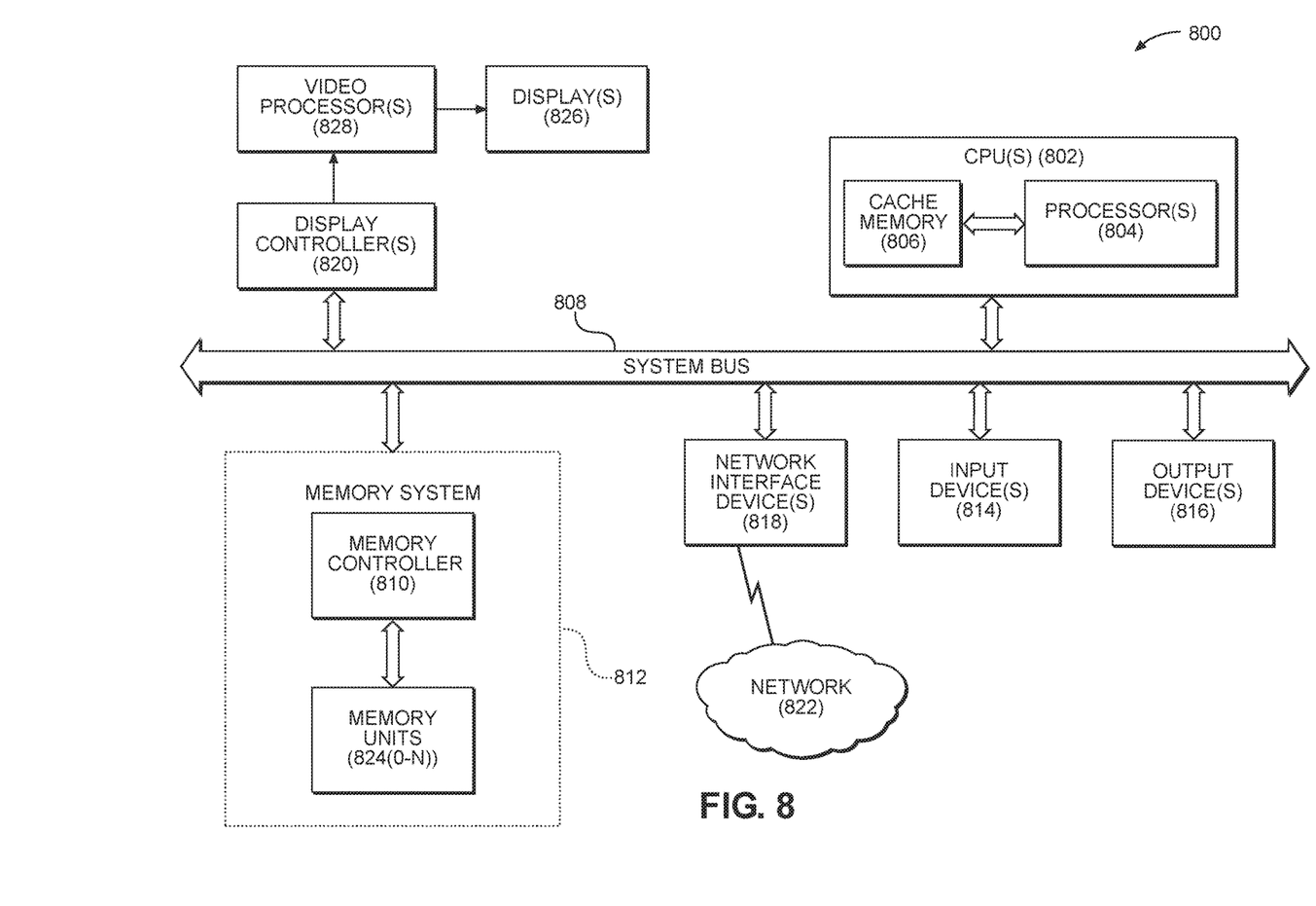
FIG. 8 is a block diagram of an exemplary processor-based system that can include a multi-phase clock generation circuit that employs phase error detection between multiple delay circuit outputs to provide error correction using DLL circuits such as those shown in FIGS. 2 and 4A, 5, and 6.

In this regard, FIG. 8 illustrates an example of a processor-based system 800 that can employ the multi-phase clock generators 200, 400, 500, and 600 illustrated in FIGS. 2, 4A, 5, and 6. In this example, the processor-based system 800 includes one or more central processing units (CPUs) 802, each including one or more processors 804. The CPU(s) 802 may have cache memory 806 coupled to the processor(s) 804 for rapid access to temporarily stored data. The CPU(s) 802 is coupled to a system bus 808 and can intercouple master and slave devices included in the processor-based system 800. As is well known, the CPU(s) 802 communicates with these other devices by exchanging address, control, and data information over the system bus 808. For example, the CPU(s) 802 can communicate bus transaction requests to a memory controller 810 as an example of a slave device. Although not illustrated in FIG. 8, multiple system buses 808 could be provided, wherein each system bus 808 constitutes a different fabric.

Other master and slave devices can be connected to the system bus 808. As illustrated in FIG. 8, these devices can include a memory system 812, one or more input devices 814, one or more output devices 816, one or more network interface devices 818, and one or more display controllers 820, as examples. The input device(s) 814 can include any type of input device, including, but not limited to, input keys, switches, voice processors, etc. The output device(s) 816 can include any type of output device, including, but not limited to, audio, video, other visual indicators, etc. The network interface device(s) 818 can be any devices configured to allow exchange of data to and from a network 822. The network 822 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 818 can be configured to support any type of communications protocol desired. The memory system 812 can include one or more memory units 824(0-N).

The CPU(s) 802 may also be configured to access the display controller(s) 820 over the system bus 808 to control information sent to one or more displays 826. The display controller(s) 820 sends information to the display(s) 826 to be displayed via one or more video processors 828, which process the information to be displayed into a format suitable for the display(s) 826. The display(s) 826 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A multi-phase clock generator, comprising:
   a delay circuit comprising a clock input and two clock signal outputs;
   at least two phase detectors each comprising a mixer, each mixer comprising at least two phase signal inputs and an error signal output, wherein one of the at least two phase signal inputs is coupled to at least one of the two clock signal outputs; and
   a feedback circuit comprising:
      a low pass filter;
      a charge pump; and
      two inputs coupled to the error signal output of the at least two phase detectors and a delay control signal output configured to output a delay control signal based on a combination of signals received at the two inputs.

2. The multi-phase clock generator of claim 1, wherein the feedback circuit comprises a summing circuit and the delay control signal based on the combination of the signals is based on an output of the summing circuit.

3. The multi-phase clock generator of claim 2, wherein the delay circuit comprises a ninety degree phase delay circuit and the two clock signal outputs comprise a positive Q signal and a negative Q signal.

4. The multi-phase clock generator of claim 3, wherein each of the at least two phase detectors receives both the positive Q signal and the negative Q signal as well as a positive I signal and a negative I signal from the clock input.

5. The multi-phase clock generator of claim 2, further comprising a plurality of additional delay circuits serially coupled to the delay circuit, each of the plurality of additional delay circuits comprising two clock signal outputs.

6. The multi-phase clock generator of claim 5, wherein the two clock signal outputs of each of the plurality of additional delay circuits comprise a delayed clock output and a complement delayed clock output.

7. The multi-phase clock generator of claim 5, wherein the feedback circuit comprises a plurality of summing circuits.

8. The multi-phase clock generator of claim 5, wherein the delay circuit and the plurality of additional delay circuits comprise a number of delay circuits that evenly divides into 360 degrees.

9. The multi-phase clock generator of claim 5, wherein each of the plurality of additional delay circuits comprises a uniform delay circuit.

10. The multi-phase clock generator of claim 2, further comprising a buffer circuit positioned before the clock input and configured to be coupled to a reference clock.

11. The multi-phase clock generator of claim 2, further comprising a load balancing delay circuit coupled to the two clock signal outputs.

12. The multi-phase clock generator of claim 1 integrated into one of: a delay locked loop (DLL), a frequency divider, and a millimeter wave transceiver.

13. A multi-phase clock generator, comprising:
a controlled delay line configured to receive a reference clock signal, the controlled delay line comprising a plurality of delay circuits each configured to delay an input signal based on the reference clock signal, based on a delay control signal to provide a respective unique phase-shifted output signal; and
a phase error detector circuit, comprising:
a plurality of phase detectors, each phase detector comprising a mixer, each mixer configured to:
detect a phase difference between received phase-shifted output signals from the controlled delay line; and
provide a phase error based on the detected phase difference between the received phase-shifted output signals; and
a feedback circuit comprising a low pass filter and a charge pump, the feedback circuit configured to:
combine detected phase differences from the plurality of phase detectors; and
provide the delay control signal to the plurality of delay circuits based on a combination of the detected phase differences.

14. The multi-phase clock generator of claim 13, wherein each of the plurality of phase detectors is configured to receive at least two unique phase-shifted output signals from two different delay circuits among the plurality of delay circuits.

15. The multi-phase clock generator of claim 13, wherein the plurality of delay circuits comprises a number of delay circuits that evenly divides into 360 degrees.

16. The multi-phase clock generator of claim 13, wherein each of the plurality of delay circuits comprises a uniform delay circuit.

17. The multi-phase clock generator of claim 13, wherein the plurality of delay circuits is serially arranged.

18. The multi-phase clock generator of claim 13, wherein each of the plurality of delay circuits comprises a first signal output and a complement signal output.

19. The multi-phase clock generator of claim 13 integrated into an integrated circuit (IC).

20. The multi-phase clock generator of claim 13 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; a millimeter wave transceiver, and a multicopter.

21. A method of providing error correction in a multi-phase clock generator, the method comprising:
receiving a reference clock signal;
outputting from a delay circuit a first clock signal and a complement clock signal;
detecting a phase error associated with at least one of either the first clock signal or the complement clock signal with a first phase detector comprising a first mixer;
summing phase errors from the first phase detector and a second phase detector comprising a second mixer; and
providing a filtered control signal to the delay circuit based on the summing.

22. The method of claim 21, further comprising buffering the reference clock signal.

23. The method of claim 21, further comprising using multiple serially connected delay circuits to generate a plurality of clock signals and complement clock signals.

24. The method of claim 21, wherein the first clock signal comprises a positive Q signal and the complement clock signal comprises a negative Q signal.

* * * * *